United States Patent
Nagamatsu et al.

(10) Patent No.: US 8,269,298 B2
(45) Date of Patent: Sep. 18, 2012

(54) SEMICONDUCTOR MODULE AND CAMERA MODULE MOUNTING SAID SEMICONDUCTOR MODULE

(75) Inventors: Masayuki Nagamatsu, Moriguchi (JP); Ryosuke Usui, Moriguchi (JP); Yasunori Inoue, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 278 days.

(21) Appl. No.: 12/727,913

(22) Filed: Mar. 19, 2010

(65) Prior Publication Data

US 2010/0244171 A1    Sep. 30, 2010

(30) Foreign Application Priority Data

Mar. 31, 2009 (JP) ................. 2009-086620

(51) Int. Cl.
*H01L 21/00* (2006.01)
(52) U.S. Cl. ..................... 257/432; 257/433
(58) Field of Classification Search ........... 257/432–433
See application file for complete search history.

(56) References Cited

U.S. PATENT DOCUMENTS

| | | | | |
|---|---|---|---|---|
| 5,801,438 A * | 9/1998 | Shirakawa et al. | ............ | 257/685 |
| 6,605,828 B1 * | 8/2003 | Schwarzrock et al. | ......... | 257/81 |
| 6,861,675 B2 * | 3/2005 | Tomioka et al. | ................ | 257/82 |
| 6,943,423 B2 * | 9/2005 | Kim | ............................... | 257/433 |
| 7,122,874 B2 * | 10/2006 | Kim | ............................... | 257/433 |
| 7,759,751 B2 * | 7/2010 | Ono | ................................ | 257/432 |
| 7,782,624 B2 * | 8/2010 | Fujii | .................................. | 361/720 |
| 8,013,370 B2 * | 9/2011 | Kobayashi et al. | ............ | 257/291 |
| 8,076,787 B2 * | 12/2011 | Hayashi | .......................... | 257/786 |
| 2004/0000674 A1 * | 1/2004 | Tomioka et al. | ................. | 257/88 |
| 2005/0073017 A1 * | 4/2005 | Kim | ................................ | 257/433 |
| 2007/0158773 A1 * | 7/2007 | Cheng | ............................ | 257/433 |
| 2008/0006947 A1 * | 1/2008 | Akiba et al. | .................... | 257/778 |
| 2008/0073734 A1 * | 3/2008 | Kong | .............................. | 257/432 |
| 2008/0211045 A1 * | 9/2008 | Ono | ................................ | 257/432 |
| 2009/0152659 A1 * | 6/2009 | Hiltunen et al. | ............... | 257/432 |
| 2009/0168367 A1 * | 7/2009 | Fujii | ................................ | 361/720 |
| 2009/0315133 A1 * | 12/2009 | Chang | ............................ | 257/433 |
| 2010/0032781 A1 * | 2/2010 | Ryu | ................................ | 257/432 |
| 2010/0059844 A1 * | 3/2010 | Tanaka | ........................... | 257/432 |
| 2010/0065929 A1 * | 3/2010 | Okada et al. | ................... | 257/415 |
| 2010/0090333 A1 * | 4/2010 | Hayashi | ......................... | 257/693 |
| 2010/0117175 A1 * | 5/2010 | Shizuno | ......................... | 257/432 |
| 2010/0244171 A1 * | 9/2010 | Nagamatsu et al. | .......... | 257/433 |
| 2010/0252902 A1 * | 10/2010 | Tanida et al. | .................. | 257/433 |
| 2010/0314703 A1 * | 12/2010 | Chen | .............................. | 257/432 |
| 2010/0320554 A1 * | 12/2010 | Toumiya et al. | ............... | 257/432 |
| 2011/0012220 A1 * | 1/2011 | Park et al. | ...................... | 257/433 |
| 2011/0109791 A1 * | 5/2011 | Obara et al. | ................... | 348/374 |

(Continued)

FOREIGN PATENT DOCUMENTS

JP      2007065056 A   *   3/2007

(Continued)

*Primary Examiner* — Laura Menz
(74) *Attorney, Agent, or Firm* — McDermott Will & Emery LLP

(57) ABSTRACT

A semiconductor module includes a lower wiring substrate having a semiconductor device mounted and an upper wiring substrate having an opening in a position corresponding to the semiconductor device and having a packaging-component mountable region around the opening. The lower wiring substrate and the upper wiring substrate are electrically connected to each other via a plurality of solder balls provided around the semiconductor device. The solder balls are covered with light blocking under-fills.

13 Claims, 8 Drawing Sheets

U.S. PATENT DOCUMENTS

| | | | |
|---|---|---|---|
| 2011/0133301 A1* | 6/2011 | Tang | 257/432 |
| 2011/0174527 A1* | 7/2011 | Nagamatsu et al. | 174/261 |
| 2011/0248367 A1* | 10/2011 | Yang et al. | 257/432 |
| 2012/0018871 A1* | 1/2012 | Lee et al. | 257/698 |
| 2012/0056292 A1* | 3/2012 | Suzuki et al. | 257/432 |
| 2012/0105706 A1* | 5/2012 | Kong | 348/340 |

FOREIGN PATENT DOCUMENTS

| | | | |
|---|---|---|---|
| JP | 2007065058 A | * | 3/2007 |
| JP | 2007184801 A | * | 7/2007 |
| JP | 2008-304911 | | 12/2008 |
| JP | 2010238995 A | * | 10/2010 |
| JP | 2011097026 A | * | 5/2011 |

* cited by examiner

1000

US 8,269,298 B2

SEMICONDUCTOR MODULE AND CAMERA MODULE MOUNTING SAID SEMICONDUCTOR MODULE

CROSS-REFERENCE TO RELATED APPLICATIONS

This application is based upon and claims the benefit of priority from the prior Japanese Patent Applications No. 2009-086620, filed on Mar. 31, 2009, the entire contents of which are incorporated herein by reference.

BACKGROUND OF THE INVENTION

1. Field of the Invention

The present invention relates to a semiconductor module and a camera module mounting said semiconductor module.

2. Description of the Related Art

Portable electronic devices, such as mobile phones, PDAs, DVCs and DSCs, are gaining increasing sophistication in functions and features, such as camera functions added for taking images of persons and scenery. And in order for such products to be accepted by the market, they have to be smaller in size and lighter in weight, and for the realization thereof, there is a growing demand for highly-integrated system LSIs.

On the other hand, these electronic devices are expected to be easier or handier to use, and therefore the LSIs used in those devices are required to be more functionally sophisticated and better performing. Thus the higher integration of LSI chips is causing increases in I/O count, which in turn generates demand for smaller and thinner packages. To satisfy both these requirements, it is strongly expected that semiconductor packages just right for the high board density packaging of semiconductor parts be developed. In response to such expectations and demands, further thinning is required for a semiconductor module which is used to mount semiconductor components thereon.

For example, a camera module is one of such conventional portable electronics products and will be explained here.

FIG. 8 is a cross-sectional view showing a structure of a conventional camera module.

As shown in FIG. 8, a conventional camera module 1000 has a structure of a printed-circuit board 10, a lens barrel 46, and a cylindrical body 45 assembled together. On the printed-circuit board 10, CCD or CMOS image sensors 11 are mounted by wire bonding 14, and a casing 40 of a plastic material is disposed in such a manner as to cover the sensors 11.

And the cylindrical body 45 and the lens barrel 46 (casing 40) of the camera module 1000 are joined together with the cylindrical body 45 screwed into the threaded part on the inner periphery of the lens barrel 46.

Further, an IR (infrared) cut filter 22 is disposed between a lens 41, which is mounted to the cylindrical body 45 in a position above the printed-circuit board 10, and the image sensors 11, which are semiconductor devices mounted on the top surface of the printed-circuit board 10, so as to cut off infrared rays of excessively long wavelengths that may otherwise enter the image sensor 11.

There have been attempts at downsizing camera module bodies to be placed in portable electronics products, such as mobile phones. With conventional semiconductor modules, however, chip parts (passive components, such as resistors and capacitors, or drive IC chips), which are examples of package components to be mounted to drive the lens or the semiconductor devices (CMOS sensors), have to be mounted within a space defined and enclosed by the casing 40, the lens barrel 46, the cylindrical body 45 and the printed-circuit board 10 as shown in FIG. 8. In other words, the region where the chip parts can be mounted is only the space above the semiconductor devices on the printed-circuit board 10.

Thus, attempts at downsizing the camera module body have been unsuccessful because the chip parts have to be mounted on the camera module body by stacking them high in the aforesaid space or providing a wider area for their placement.

SUMMARY OF THE INVENTION

A semiconductor module according to one embodiment comprises: a first wiring substrate having a semiconductor device mounted thereon; and a second wiring substrate having an opening in a position corresponding to the semiconductor device and having a region, where packaging components are mountable, around the opening, wherein the first wiring substrate and the second wiring substrate are electrically connected to each other via a plurality of conductive members being present around the semiconductor device, and wherein the plurality of conductive members are covered with a light blocking material.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Hereinbelow, the embodiments will be described with reference to the drawings.

(First Embodiment)

Figure 1:
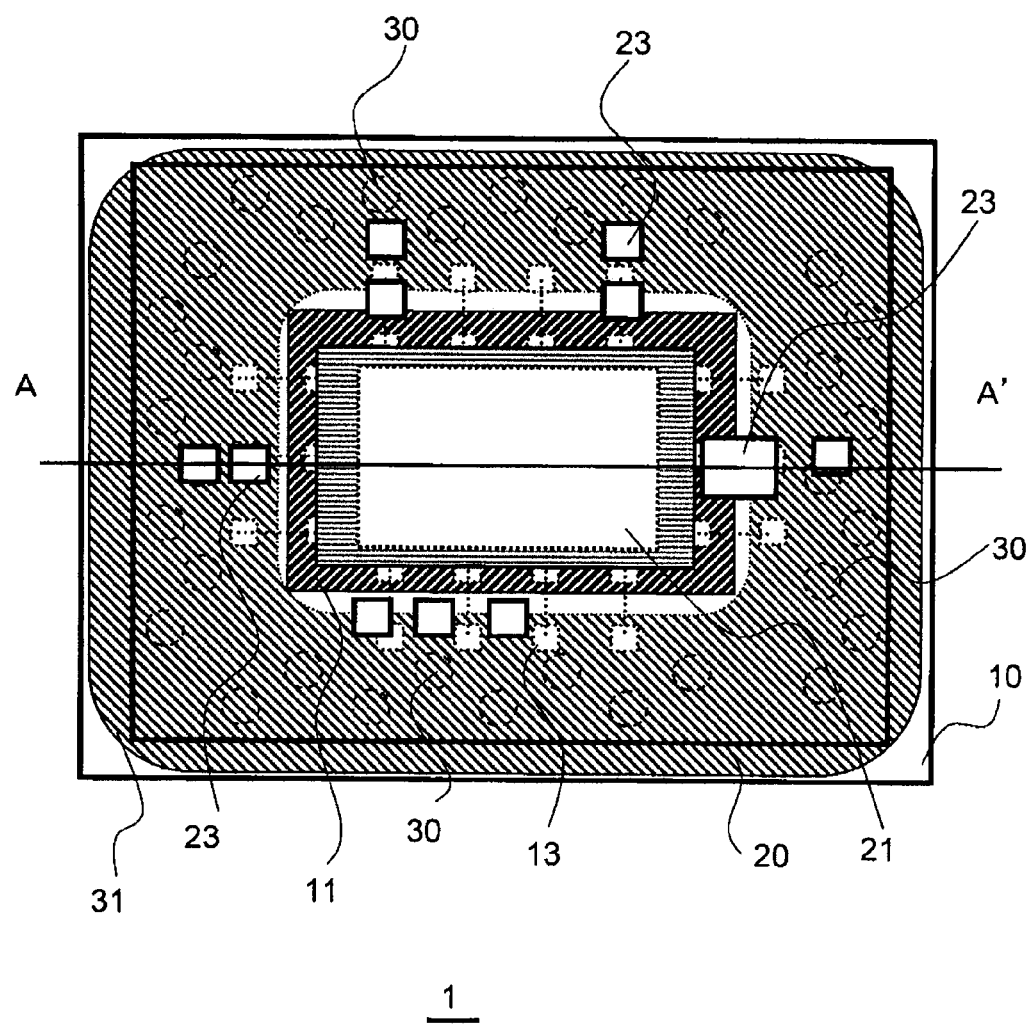
FIG. 1 is a plan view of a structure of a semiconductor module according to a first embodiment of the present invention.

FIG. 1 is a plan view of a structure of a semiconductor module 1 according to a first embodiment of the present invention.

The semiconductor module 1 has a lower wiring substrate 10 and an upper wiring substrate 20, and the lower wiring substrate 10 and the upper wiring substrate 20 are electrically connected to each other via solder balls 30 which are an example of a connecting conductive member. Also, chip parts 23, such as passive components and drive ICs, are mounted on the top surface of the upper wiring substrate 20. The semiconductor module 1 is about 10 mm×about 10 mm in size.

Figure 2A:
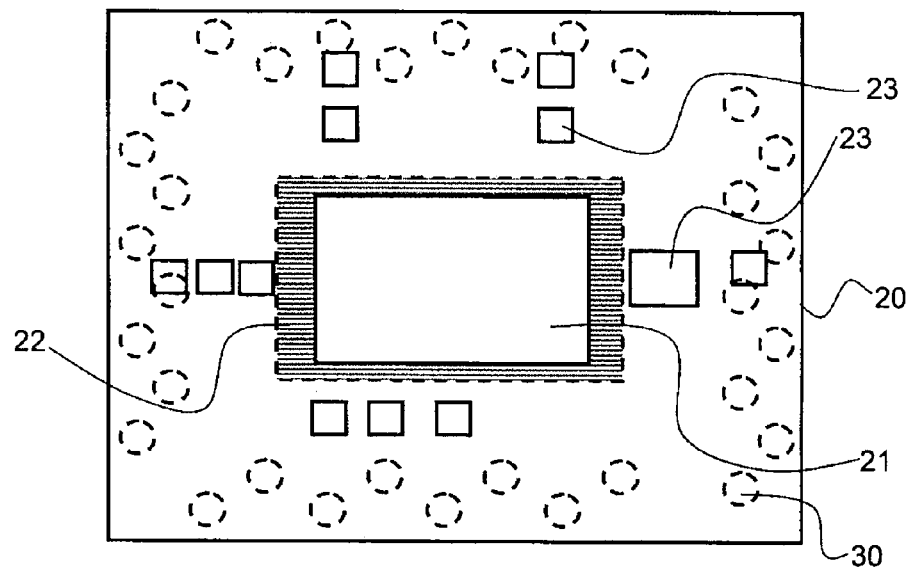
FIGS. 2A and 2B are plan views of an upper wiring substrate and a lower wiring substrate, respectively, of a semiconductor module according to a first embodiment of the present invention.
Figure 2B:
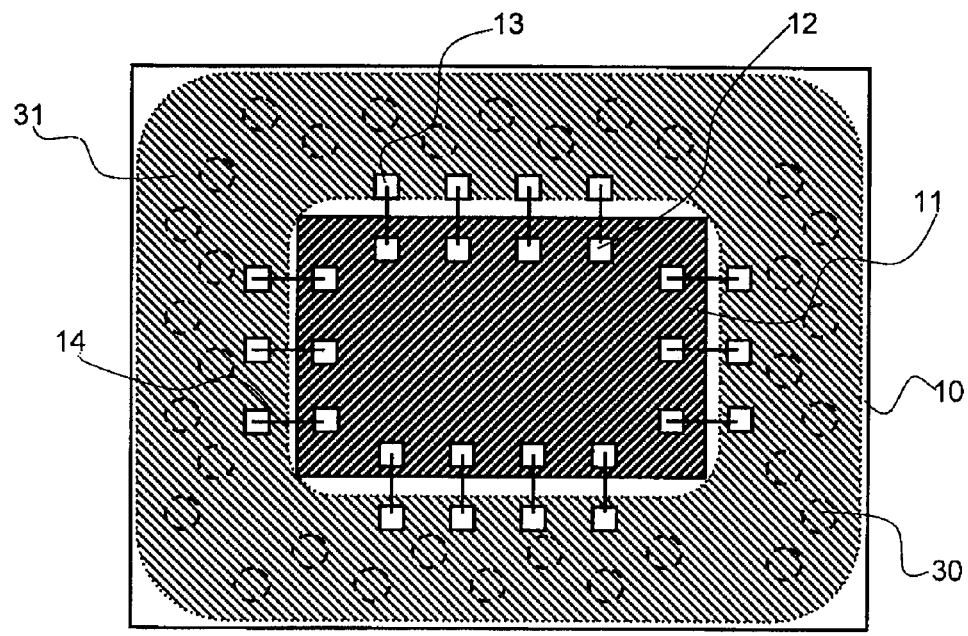

FIGS. 2A and 2B are the plan views of the upper wiring substrate 20 and the lower wiring substrate 10, respectively, of the semiconductor module shown in FIG. 1.

The upper wiring substrate 20 shown in FIG. 2A is a wiring substrate of so-called multiple wiring layers comprised of a plurality of wiring layers and insulating layers and has an opening 21 in a position corresponding to a semiconductor device 11 mounted on the lower wiring substrate 10. The opening 21, viewed from above the upper wiring substrate 20, is substantially square in shape. The shape thereof is not required to be square, but may be circular, elliptical, or rectangular, for instance. In the case where the semiconductor device 11 mounted on the lower wiring substrate 10 is provided with a functional part for light emission or reception, the shape of the opening 21 only has to be such that the light-emitting or light-receiving functional part can be recognized visually through the opening 21 when viewed from the upper wiring substrate 20 side. The thickness of the semiconductor device 11 is about 100 to 150 μm.

For example, when the semiconductor module 1 is used as a camera module, chip parts for driving the lens (e.g., drive ICs, power supply ICs, and passive components such as resistors and capacitors) are arranged on the periphery of the opening 21 (on the top surface of the upper wiring substrate 20).

An infrared (IR) cut filter 22, which is an example of an optical filter for filtering out near-red light, is disposed in such a manner as to cover the opening. Such an optical filter may include an ultraviolet cut filter or a polarizer, for instance. Note that such an optical filter may be provided as required.

Now a description will be given of the lower wiring substrate 10 shown in FIG. 2B.

The lower wiring substrate 10 is a wiring substrate of multiple wiring layers comprised of a plurality of wiring layers and insulating layers, and it is larger than the outer periphery of the above-described upper wiring substrate 20. For example, the lower wiring substrate 10 is about 10 mm in length and width, about 2 mm larger than the upper wiring substrate 20 in length and width. In other words, the outer periphery of the upper wiring substrate 20 stays within the outer periphery of the lower wiring substrate 10. This structure allows the use of the periphery of the lower wiring substrate 10 as a region for supporting a casing 40 (supporting portion) when the semiconductor module 1 is used as a camera module to be discussed later (see FIG. 7). The lower wiring substrate 10 also has a copper sheet as a base material layer among the multiple layers, which serves to maintain the rigidity of the wiring substrate. On the top surface of the lower wiring substrate 10, the semiconductor device 11 is mounted substantially in the middle thereof in a position corresponding to the opening 21. The semiconductor device 11 is bonded to the surface of the lower wiring substrate 10 with an adhesive resin. Concrete examples of the semiconductor device 11 may include a CMOS sensor, which is a light receiving device, an LED, which is a light emitting device, and semiconductor chips such as an integrated circuit (IC) or a large-scale integrated circuit (LSI). The CMOS sensor or the LED will be placed such that the light receiving part thereof corresponds in position to the opening 21.

Also, device electrodes 12 are formed on the top surface of the semiconductor device 11, and the lower wiring substrate 10 and the semiconductor device 11 are electrically connected to each other with bonding wires 14 connecting the device electrodes 12 to electrode terminals 13 provided on the surface of the lower wiring substrate 10.

It should be noted that the semiconductor device 11 may also be of a structure with the device electrodes 12 provided on the underside thereof. In such a case, the device electrodes 12 may be connected electrically to the lower wiring substrate 10 by a so-called flip-chip wireless bonding without using the bonding wires.

A detailed structure of connection by solder balls between the lower wiring substrate 10 and the upper wiring substrate 20 will be discussed later.

The upper wiring substrate 20 and the lower wiring substrate 10 as described above are electrically connected to each other by solder balls 30.

Figure 3:
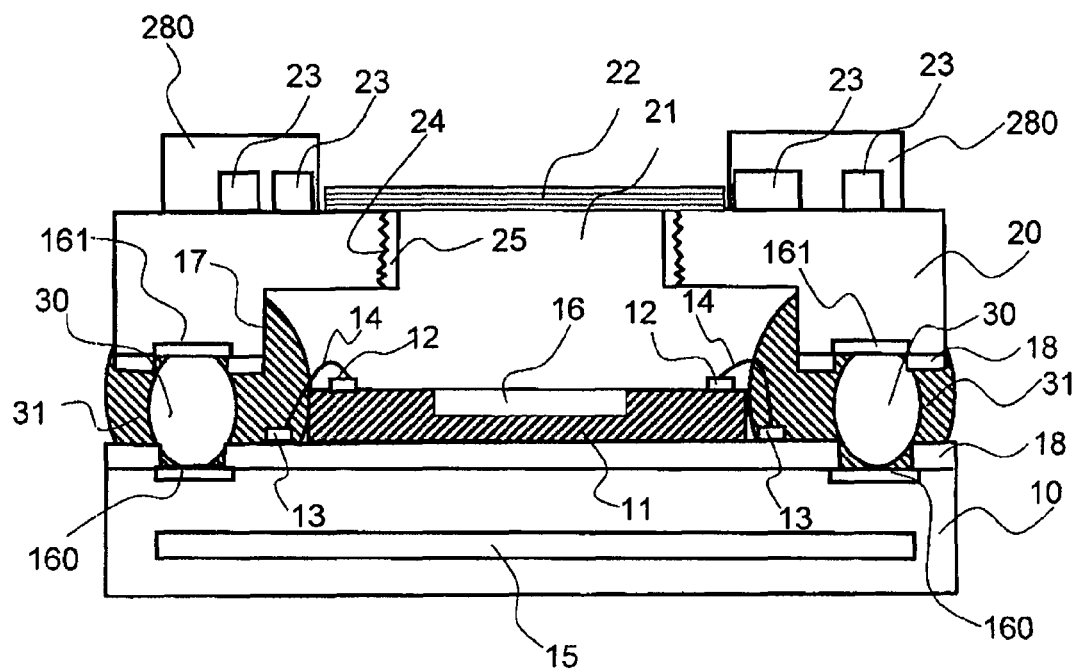
FIG. 3 is a cross-sectional view, taken along line A-A', of a semiconductor module according to a first embodiment of the present invention.

FIG. 3 is a cross-sectional view taken along line A-A' of FIG. 1.

As shown in FIG. 3, the lower wiring substrate 10 and the upper wiring substrate 20 are electrically connected to each other via the solder balls 30, which are conductive members for connection. The solder balls 30 are disposed near the peripheries of the upper wiring substrate 20 and the lower wiring substrate 10.

Formed in the peripheral regions where the wiring substrates 10 and 20 are connected are first electrodes 160 and third electrodes 161 to which the solder balls 30 are connected. The first electrodes 160 and the third electrodes 161 are so structured as to be exposed through the openings in photo solder resist 18 which is formed over them.

Note here that the solder balls 30 are arranged in a "zigzag pattern" along the peripheries of the two wiring substrates 10 and 20 as shown in FIGS. 1 and 2. That is, along one side of the lower wiring substrate 10, for instance, the solder balls 30 are arranged in two rows, and each of the solder balls in one row is located in a position corresponding to the middle position between two adjacent solder balls in the other row.

The arrangement like this not only provides more connection regions with efficiency between the upper wiring substrate 20 and the lower wiring substrate 10, but also can prevent entry of unnecessary light from the exterior or leak of light to the exterior better than in a single-row arrangement.

Further, an under-fill 31, which is an adhesive resin such as epoxy resin mixed with a light blocking material, is placed to fill the space between the solder balls 30 and cover them. This will strengthen the adhesion between the lower wiring substrate 10 and the upper wiring substrate 20 and at the same time can prevent the leak of light from the semiconductor module 1 or the incidence of external light.

Thus, according to the present embodiment, the "zigzag pattern" arrangement of the solder balls 30, in combination with the placement of a light-blocking under-fill resin to cover them, prevents the release of unnecessary light from the solder ball connections to the exterior or the entry of unnecessary light from the exterior.

The under-fill 31 is placed in the peripheral region of the wiring substrates 10 and 20 marked with diagonal lines (top left to bottom right) in FIG. 1 and FIG. 2B. The inner edges of the under-fill 31 are so located as not to cover the semiconductor device 11. The lower wiring substrate 10 has supporting portions protruding outside the upper wiring substrate 20, and when a casing of a camera module is mounted thereon, the under-fill 31 is not placed in the supporting portions. That is, the under-fill 31 is placed only as far as the edges of the upper wiring substrate 20.

Note that the opening 21 is cut out of the upper wiring substrate 20 in the position corresponding to the semiconductor device 11, using a cutter, a drill, or laser, for instance. And the process of forming the opening 21 may result in a roughness 24 (see FIG. 3) on the peripheral faces thereof. Then, during the use of the semiconductor module 1, insulation resin pieces, which are the swarf of the upper wiring substrate 20 from the roughness 24, may fall onto the semiconductor device 11, thus totally or partially covering the light-emitting face or light-receiving face formed on the semiconductor device 11. This may considerably hamper the function of light emission or light reception. To prevent the hindrance, an electroless plating is performed on the surface of the roughness 24, for instance, simultaneously with the formation of the electrodes on the surface of the upper wiring substrate 20, thereby covering the peripheral faces of the opening 21 with an Au layer laminated on top of a Ni layer (hereinafter referred to as "Ni/Au layer") 25. By doing so, it is possible to prevent the swarf from dropping from the peripheral faces of the opening 21 in the upper wiring substrate 20 onto the semiconductor device. In addition, it is possible to utilize the light from the light-emitting face or the light incident on the light-receiving face more efficiently as it is reflected by the metallic faces of the opening 21.

(First Modification)

Figure 4:
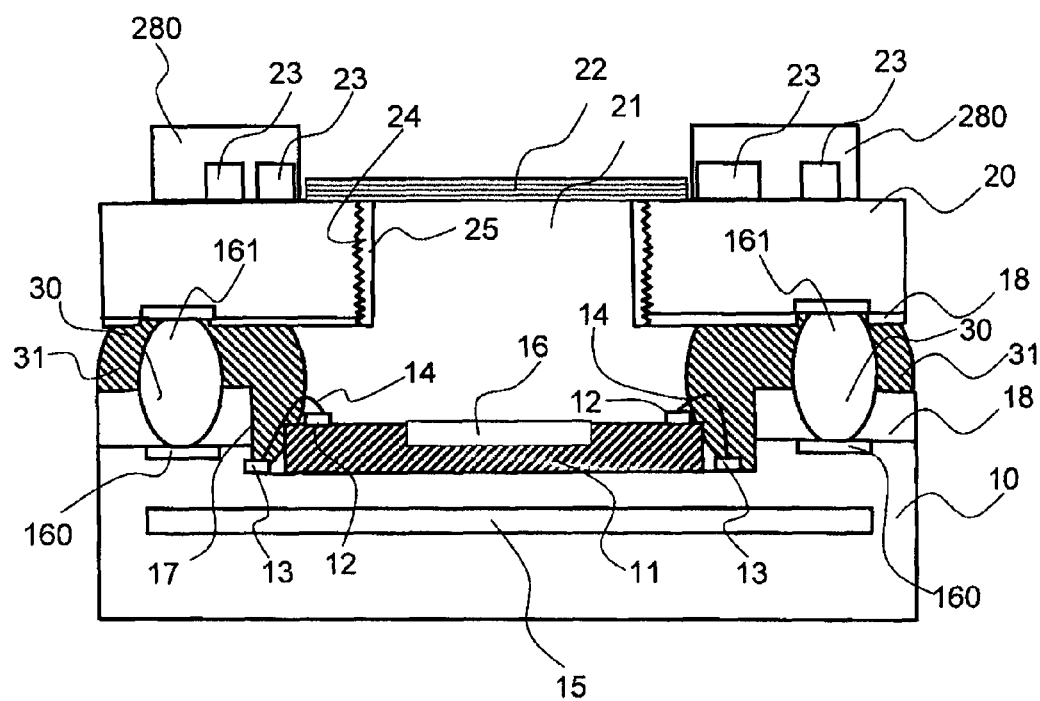
FIG. 4 illustrates a modification of a semiconductor module according to a first embodiment.

A modification of the semiconductor module according to the first embodiment is now shown in FIG. 4.

A semiconductor module shown in FIG. 4 differs from the above-described semiconductor module shown in FIG. 3 in the shapes of the upper wiring substrate 20 and the lower wiring substrate 10.

Compared with the structure of the upper substrate 20 shown in FIG. 3 where a recessed part corresponding to the shape of the semiconductor device 11 is provided upwardly in FIG. 3, the semiconductor module shown in FIG. 4 is of a structure such that the upper wiring substrate 20 does not have such a recessed part. Since there is no recessed part in the upper wiring substrate 20 of the semiconductor module according to the first modification, any of part constituting the wiring substrate 20 is neither removed nor hollowed out, so that the strength of the upper wiring substrate 20 can be increased as compared with the first embodiment.

As for the lower wiring substrate 10, there is a recessed part 17 within which the semiconductor device 11 is contained. Thus the upper wiring substrate 20 and the lower wiring substrate 10 are electrically connected to each other in the periphery of the recessed part 17 by solder balls 30. In the lower wiring substrate 10, the semiconductor device 11 is disposed in the recessed part 18. Thus if the semiconductor device 11 used is a light receiving sensor or light emitting device, unnecessary light entering from the exterior or leakage of light can be prevented assuredly.

(Second Modification)

Figure 5:
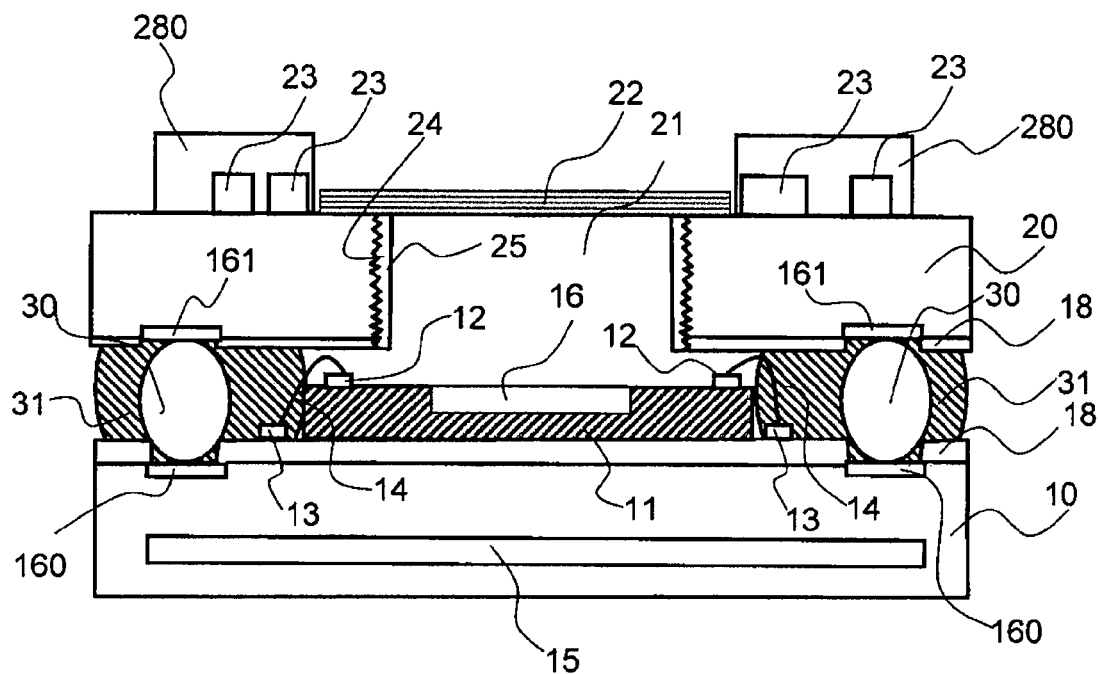
FIG. 5 illustrates another modification of a semiconductor module according to a first embodiment.

FIG. 5 shows another modification of the semiconductor module according to the first embodiment.

A semiconductor module shown in FIG. 5 differs from the above-described semiconductor module shown in FIG. 3 in the shape and the size of the upper wiring substrate 20.

Compared with the structure of the upper substrate 20 shown in FIG. 3 where a recessed part corresponding to the shape of the semiconductor device 11 is provided upwardly in FIG. 3, the semiconductor module shown in FIG. 5 is of a structure such that the upper wiring substrate 20 does not have such a recessed part. Since there is no recessed part in the upper wiring substrate 20 of the semiconductor module according to the second modification, any of part constituting the wiring substrate 20 is neither removed nor hollowed out, so that the strength of the upper wiring substrate 20 can be increased as compared with the first embodiment. Also, though the supporting portion is provided in FIG. 3, the upper wiring substrate and the lower wiring substrate have the same size in FIG. 5.

(Third Modification)

Figure 6:
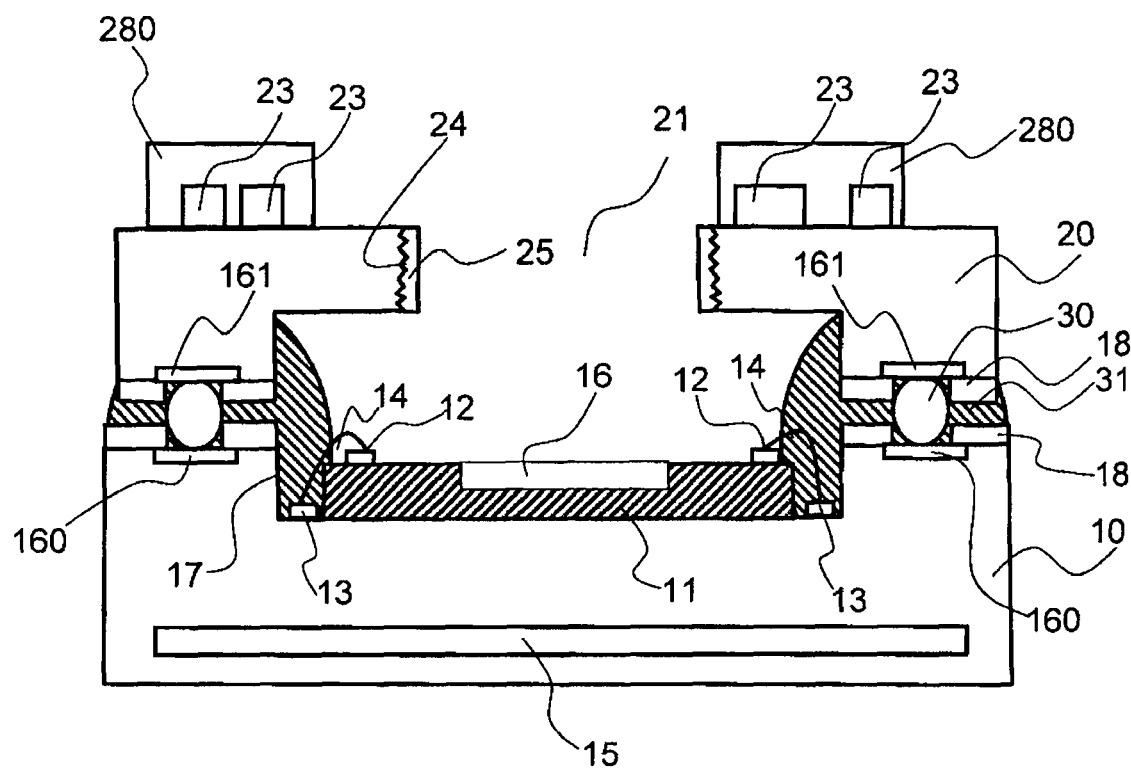
FIG. 6 illustrates still another modification of a semiconductor module according to a first embodiment.

FIG. 6 illustrates still another modification of the semiconductor module according to the first embodiment.

A semiconductor module shown in FIG. 6 differs from the above-described semiconductor module shown in FIG. 3 in that the semiconductor device 11 mounted on the lower wiring substrate 10 is provided in a recessed part of the lower wiring substrate 10. Also, no optical filter is provided in the third modification.

As described above and shown in FIG. 6, the semiconductor device 11 is disposed in the recessed part 17 provided in the lower wiring substrate 10. Hence, false operation caused by an input to the semiconductor device due to the entry of external light from the connections through the solder balls 30 can be prevented reliably. Also, the peripheries of a bottom of the recessed part where the semiconductor device 11 is disposed are protruded toward the upper wiring substrate 20. Thus the distance between the lower wiring substrate 10 and the upper wiring substrate 20 at the connections needs only to be short, so that the height and the width of the solder ball 30 can be made smaller. Since the width of the solder ball 30 can be made smaller, the width of peripheral region other than the recessed part 17 of the lower wiring substrate 10 can be made smaller.

(Second Embodiment)

A description is next given of a case where a semiconductor module according to a second embodiment is incorporated into a camera module.

Figure 7:
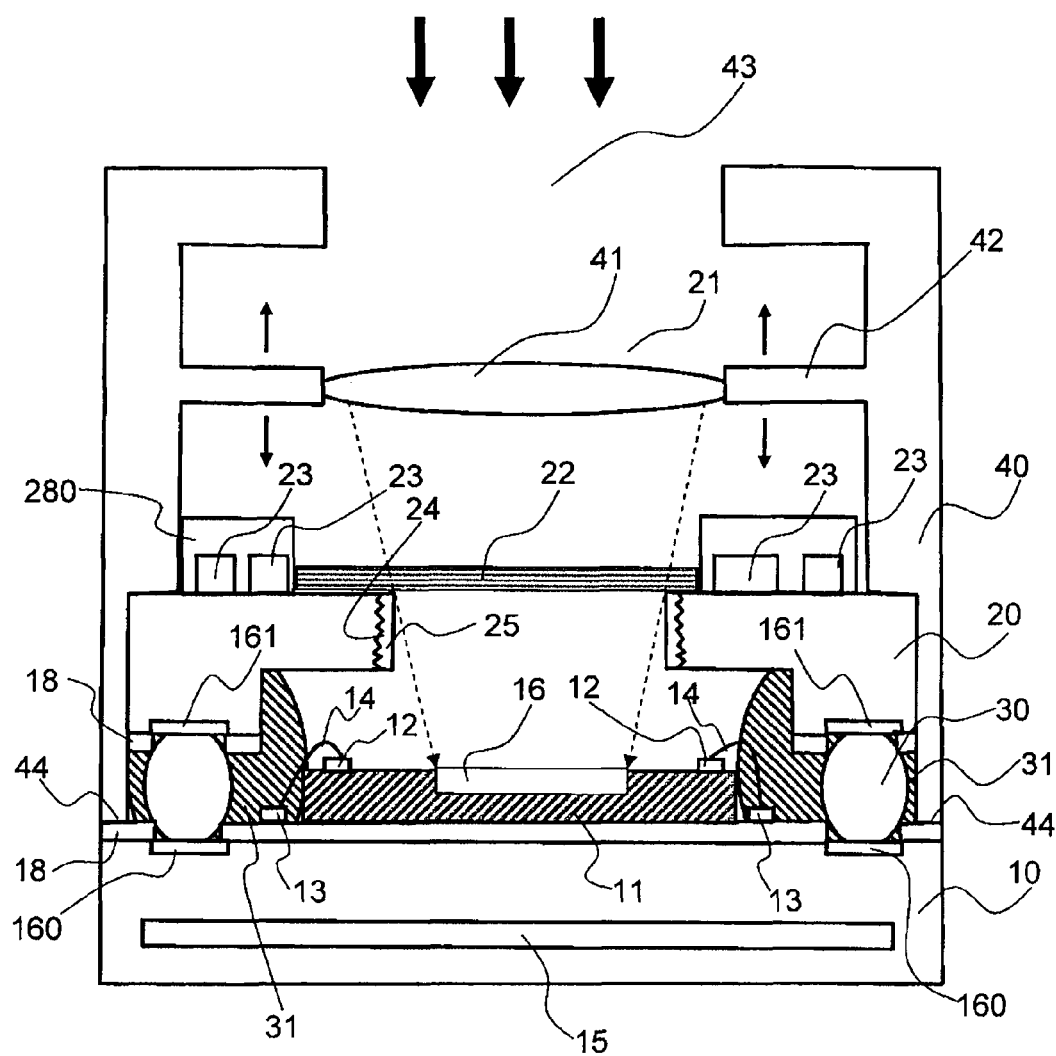
FIG. 7 is a cross-sectional view showing a structure of a camera module equipped with a semiconductor module according to a second embodiment.
Figure 8:
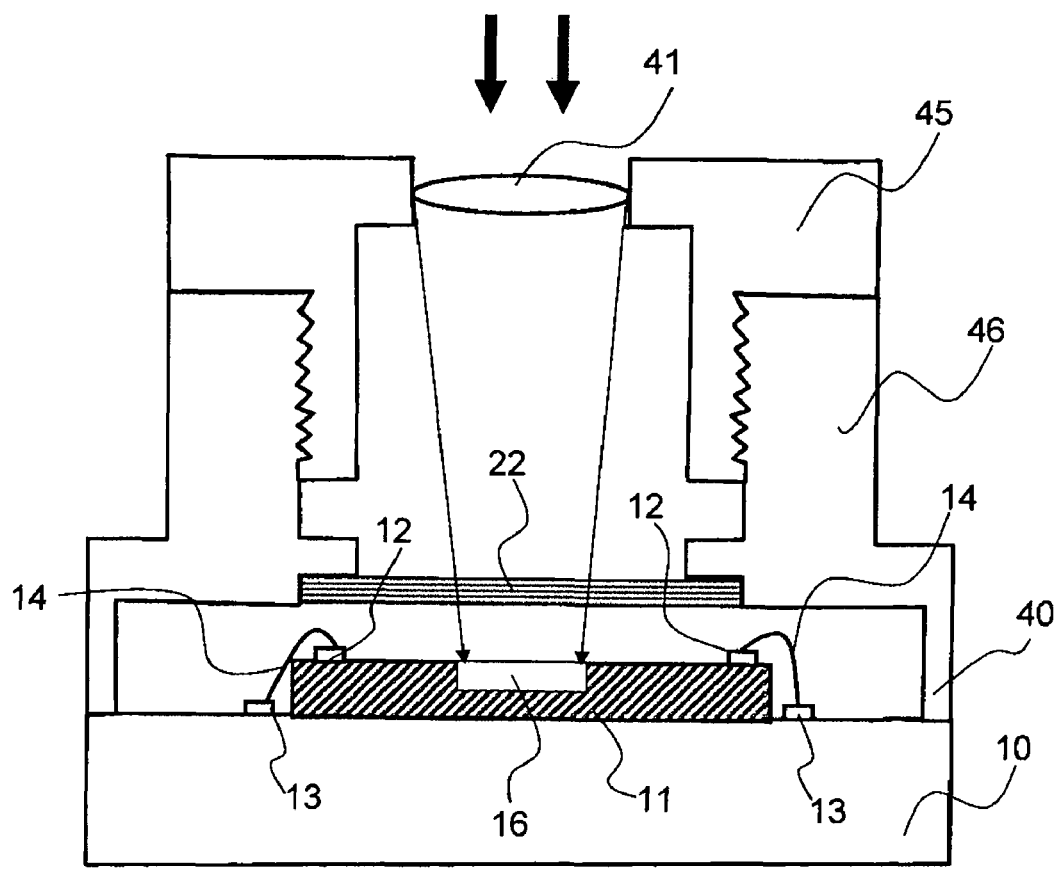
FIG. 8 is a cross-sectional view showing a structure of a conventional camera module equipped with a conventional semiconductor module.

FIG. 7 is a cross-sectional view of a camera module into which a semiconductor module according to the second embodiment is incorporated.

As described above, a CMOS sensor 11 is fixed, with an adhesive, to the upper surface of the lower wiring substrate 10 having a copper sheet 15 as a base material so that light can be received through an opening 21. The electrodes 12 of the CMOS sensor 11 and the electrodes 13 of the lower wiring substrate 10 are electrically connected with bonding wires 14.

The upper wiring substrate 20 is connected to the lower wiring substrate 10 via solder balls 30 disposed around the upper wiring substrate 20. Also, parts, for driving a lens 41 (described later), such as drive ICs and passive components (resistors, capacitors and the like) are arranged on the periphery of the opening. Not only the lens but also a chip for driving the CMOS sensor and the like can be placed there.

In order to shut off infrared rays of excessively long wavelengths entering the image sensor 11, an IR cut filter 22 is disposed between the lens 41 and the CMOS sensor 11 in such a manner as to cover the opening 21.

The solder balls 30 at connections are covered with under-fill 31 which has a light blocking material mixed in, so that entry of external light at the connections is prevented. The under-fill as illustrated in FIG. 7 does not cover the edge portions of the CMOS sensor 11. However, the arrangement may be such that the under-fill 31 covers the neighborhood of the sensor including the bonding wires 14 and electrodes 12 also. Such an arrangement will further prevent the entry of external light at the connections.

Mounted on the upper side of the semiconductor module 1, which is composed of upper and lower wiring substrates 10 and 20, is a casing 40 that supports the lens of the camera. The casing 40 has the lens 41, which collects external light (images of scenery, persons, etc.), a movable part 42, which can move up and down to adjust the focus of the lens 41, and an opening 43, which takes in the external light.

The upper wiring substrate 20 is smaller in area than the lower wiring substrate 10, and the outer periphery of the upper wiring substrate 20 is located within the outer periphery of the lower wiring substrate 10. In other words, the lower wiring substrate 10 protrudes outward from the upper wiring substrate 20, and therefore the lower wiring substrate 10 has a region for supporting the casing 40 (supporting portion) 44. At the supporting region 44, the casing 40 and the semiconductor module 1 are fixed to each other with an adhesive or by screwing one onto the other using threaded parts which are provided on the upper wiring substrate 20 and the inner periphery of the casing 40.

As described above, the semiconductor module of the present embodiment can be used as a camera module.

The conventional structure, on the other hand, requires a wider area because the drive ICs to drive the lens and the passive components have to be arranged side by side in a space made by the wiring substrate 10 and the casing 40.

However, as described above, the use of the semiconductor module of the present embodiment as a camera module will realize a downsized camera module. Downsizing is possible because the drive ICs to drive the lens and the passive components can be arranged in the peripheral region around the opening 21 in the upper wiring substrate 20.

FIGS. 3 to 7 show a structure in which the upper wiring substrate 10 is covered with a sealing resin 280. However, it should be noted that the sealing resin 280 is to be provided if necessary. Provision of the sealing resin will protect the chip parts 23, whereas absence of the sealing resin will help make the semiconductor module lighter by its weight.

Also, it is to be noted that in the semiconductor module of the present embodiment, the outer periphery of the upper wiring substrate 20 should be located within the outer periphery of the lower wiring substrate 10 or the outer peripheries of the upper and lower wiring substrates may be aligned with each other.

While the preferred embodiments of the present invention and their modifications have been described using specific terms, such description is for illustrative purposes only, and it is to be understood that changes and variations may further be made without departing from the spirit or scope of the appended claims.

What is claimed is:

1. A camera module provided with a semiconductor module, the semiconductor module, comprising:
    a first wiring substrate having a semiconductor device which is a light-receiving device mounted thereon; and
    a second wiring substrate having an opening, through which light received by the semiconductor device passes, in a position corresponding to said semiconductor device and having a region, where packaging components are mountable, around the opening,
    wherein said first wiring substrate and said second wiring substrate are electrically connected to each other via a plurality of conductive members being present around said semiconductor device, and the plurality of conductive members are covered with a light blocking material.

2. A semiconductor module according to claim 1, wherein the light blocking material is filled into spaces between the plurality of conducive members.

3. A semiconductor module according to claim 1, wherein, as viewed planarly from a first or second wiring substrate side, the plurality of conductive members are arranged in a cross-stitch pattern along peripheries of the semiconductor device.

4. A semiconductor module according to claim 2, wherein, as viewed planarly from a first or second wiring substrate side, the plurality of conductive members are arranged in a cross-stitch pattern along peripheries of the semiconductor device.

5. A semiconductor module according to claim 1, wherein an outer periphery of said second wiring substrate is aligned with or located within an outer periphery of said first wiring substrate.

6. A semiconductor module according to claim 2, wherein an outer periphery of said second wiring substrate is aligned with or located within an outer periphery of said first wiring substrate.

7. A semiconductor module according to claim 3, wherein an outer periphery of said second wiring substrate is aligned with or located within an outer periphery of said first wiring substrate.

8. A semiconductor module according to claim 1, wherein said first wiring substrate has a recessed part therein, and the semiconductor device is provided in the recessed part.

9. A camera module provided with a semiconductor module, the semiconductor module comprising:
    a first wiring substrate having a semiconductor device mounted thereon; and
    a second wiring substrate having an opening in a position corresponding to said semiconductor device and having a region, where packaging components are mountable, around the opening, wherein
    said first wiring substrate and said second wiring substrate are electrically connected to each other via a plurality of conductive members being present around said semiconductor device, and
    the plurality of conductive members are covered with a light blocking material.

10. A camera module provided with a semiconductor module, the semiconductor module comprising:
    a first wiring substrate having a semiconductor device mounted thereon; and
    a second wiring substrate having an opening in a position corresponding to said semiconductor device and having a region, where packaging components are mountable, around the opening, wherein
    said first wiring substrate and said second wiring substrate are electrically connected to each other via a plurality of conductive members being present around said semiconductor device,
    the plurality of conductive members are covered with a light blocking material, and
    the light blocking material is filled into spaces between the plurality of conducive members.

11. A camera module provided with a semiconductor module, The semiconductor module comprising:
    a first wiring substrate having a semiconductor device mounted thereon; and
    a second wiring substrate having an opening in a position corresponding to said semiconductor device and having a region, where packaging components are mountable, around the opening, wherein
    said first wiring substrate and said second wiring substrate are electrically connected to each other via a plurality of conductive members being present around said semiconductor device,
    the plurality of conductive members are covered with a light blocking material, and
    as viewed planarly from a first or second wiring substrate side, the plurality of conductive members are arranged in a cross-stitch pattern along peripheries of the semiconductor device.

12. A camera module provided with a semiconductor module, the semiconductor module comprising:
- a first wiring substrate having a semiconductor device mounted thereon; and
- a second wiring substrate having an opening in a position corresponding to said semiconductor device and having a region, where packaging components are mountable, around the opening, wherein
- said first wiring substrate and said second wiring substrate are electrically connected to each other via a plurality of conductive members being present around said semiconductor device,
- the plurality of conductive members are covered with a light blocking material, and
- an outer periphery of said second wiring substrate is aligned with or located within an outer periphery of said first wiring substrate.

13. A camera module provided with a semiconductor module, the semiconductor module comprising:
- a first wiring substrate having a semiconductor device mounted thereon; and
- a second wiring substrate having an opening in a position corresponding to said semiconductor device and having a region, where packaging components are mountable, around the opening, wherein
- said first wiring substrate and said second wiring substrate are electrically connected to each other via a plurality of conductive members being present around said semiconductor device,
- the plurality of conductive members are covered with a light blocking material
- said first wiring substrate has a recessed part therein, and the semiconductor device is provided in the recessed part.

* * * * *